(12) United States Patent
Lee et al.

(10) Patent No.: US 8,040,975 B2
(45) Date of Patent: Oct. 18, 2011

(54) APPARATUS AND METHOD FOR TRANSMITTING SIGNALS WITH MULTIPLE ANTENNAS

(75) Inventors: Seung-Joon Lee, Daejeon (KR); Jong-Ee Oh, Daejeon (KR); Yu-Ro Lee, Daejeon (KR); Dong-Seung Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 711 days.

(21) Appl. No.: 12/091,664

(22) PCT Filed: Oct. 27, 2006

(86) PCT No.: PCT/KR2006/004432
§ 371 (c)(1),
(2), (4) Date: Apr. 25, 2008

(87) PCT Pub. No.: WO2007/049944
PCT Pub. Date: May 3, 2007

(65) Prior Publication Data
US 2008/0285677 A1    Nov. 20, 2008

(30) Foreign Application Priority Data

Oct. 27, 2005 (KR) .................. 10-2005-0101755
Apr. 13, 2006 (KR) .................. 10-2006-0033703

(51) Int. Cl.
*H04L 27/00* (2006.01)
(52) U.S. Cl. ........ 375/299; 375/260; 375/267; 455/101; 455/102; 455/103; 370/478; 370/508; 370/436

(58) Field of Classification Search .................. 375/260, 375/267, 347, 299, 298; 370/478, 508, 436; 455/101, 102, 103
See application file for complete search history.

(56) References Cited

U.S. PATENT DOCUMENTS

| | | | | |
|---|---|---|---|---|
| 6,542,556 | B1 * | 4/2003 | Kuchi et al. ............ | 375/299 |
| 7,433,413 | B2 * | 10/2008 | Cheun et al. ........... | 375/260 |
| 7,453,947 | B2 * | 11/2008 | Kim et al. .............. | 375/267 |

(Continued)

FOREIGN PATENT DOCUMENTS

KR    2002-344415    11/2002
(Continued)

OTHER PUBLICATIONS

Raulefs et al. "Orthogonal Spreading With Transmit Diversity for Multicarrier Systems"; "IEEE $62^{nd}$ vehicular Techonology conference" ;vol. 1;pp. 463-467.*

(Continued)

*Primary Examiner* — Dac Ha
*Assistant Examiner* — Rahel Guarino
(74) *Attorney, Agent, or Firm* — Kile Park Goekjian Reed & McManus PLLC

(57) ABSTRACT

An apparatus for transmitting signals with multiple antennas is disclosed. The multiple antenna transmission apparatus performs space-time encoding or space-frequency encoding, and cyclically delays the encoded symbol with a plurality of delay-values to generate a plurality of delayed symbols. The multiple antenna transmission apparatus transmits the plurality of delayed symbols to the channel through a plurality of antennas. By changing the number of space areas for encoding and the number of delay-values for delaying, the number of antennas for the multiple antenna transmission apparatus is easily expanded.

15 Claims, 6 Drawing Sheets

U.S. PATENT DOCUMENTS

| | | | |
|---|---|---|---|
| 2003/0144033 A1 | 7/2003 | Sumasu et al. | |
| 2006/0067421 A1* | 3/2006 | Walton et al. | 375/267 |
| 2006/0077886 A1* | 4/2006 | Oh et al. | 370/208 |

FOREIGN PATENT DOCUMENTS

| | | |
|---|---|---|
| KR | 10-2002-0091672 | 12/2002 |
| KR | 10-2006-0032765 | 4/2006 |
| WO | 02/25857 | 3/2002 |

OTHER PUBLICATIONS

Jun Tan et al., "Multicarrier Delay Diversity Modulation", School of Electrical and Computer Engineering, Georgia Institute of Technology, GLOBECOM 2003, pp. 1633-1637.

3GPP TSG RAN WG1 Meeting #43, R1051375, Proposal for Downlink MIMO Transmission Schemes in E-UTRA, pp. 1-6.

3GPP TSG RAN WG1 Meeting #44, R160438, "Combined STBC/CDD transmission scheme for multiple antennas" pp. 1-6.

Part 16: Air Interface for Fixed and Mobile Broadband Wireless Access Systems; Amendment for Physical and Medium Access Control Layers for Combined Fixed and Mobile Operation in Licensed Bands, IEEE P802.16e/D12, Oct. 2005, pp. 1-684.

A. Huebner et al., A Simple Space-Frequency Coding Scheme with Cyclic Delay Diversity for OFDM, 2003, pp. 106-110.

Siavash M. Alamouti, A Simple transmit Diversity Technique for Wireless Communications, Oct. 1998, pp. 1451-1458, vol. 16, No. 8.

Gerhard Bauch et al., Parameter Optimization, Interleaving and Multiple Access in OFDM with Cyclic Delay Diversity, 2004, pp. 505-509.

Ronald Raulefs et al., Orthogonal Spreading with Transmit Diversity for Multicarrier Systems, 2005, pp. 463-467.

International Search Report—PCT/KR2006/004432 dated May 7, 2008.

Written Opinion—PCT/KR2006/004432 dated May 7, 2008.

\* cited by examiner

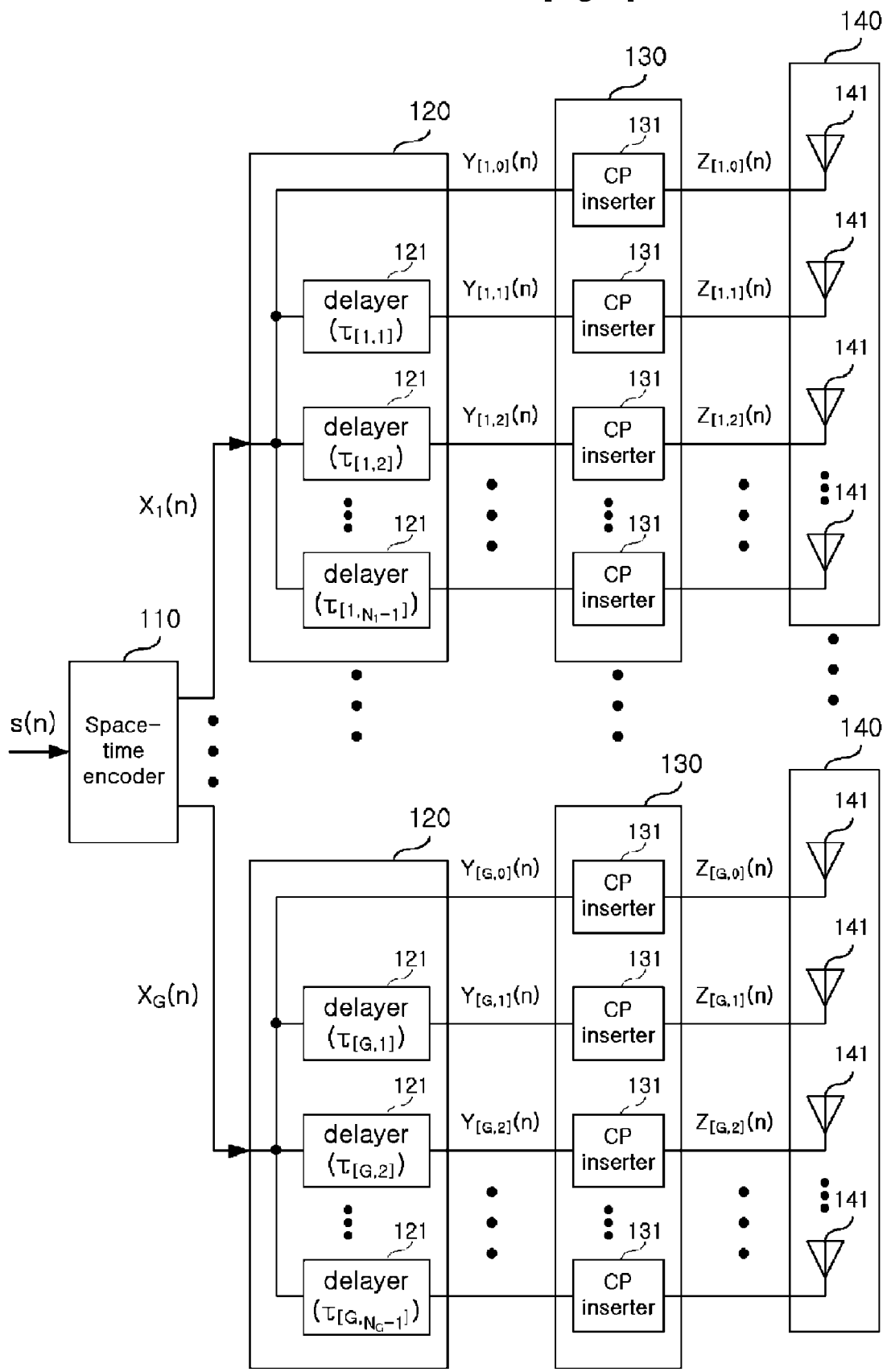
[Fig. 1]

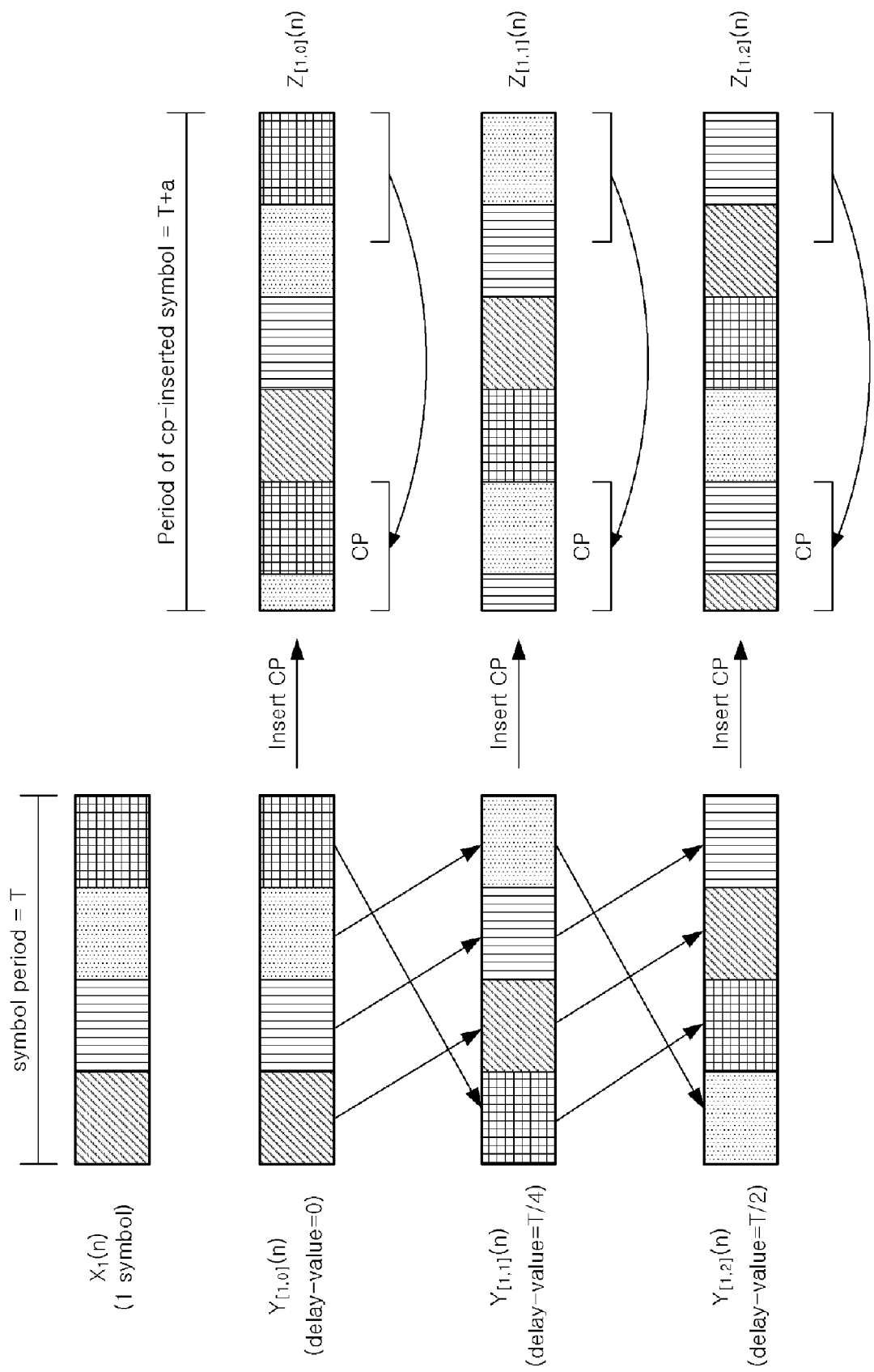
[Fig. 2]

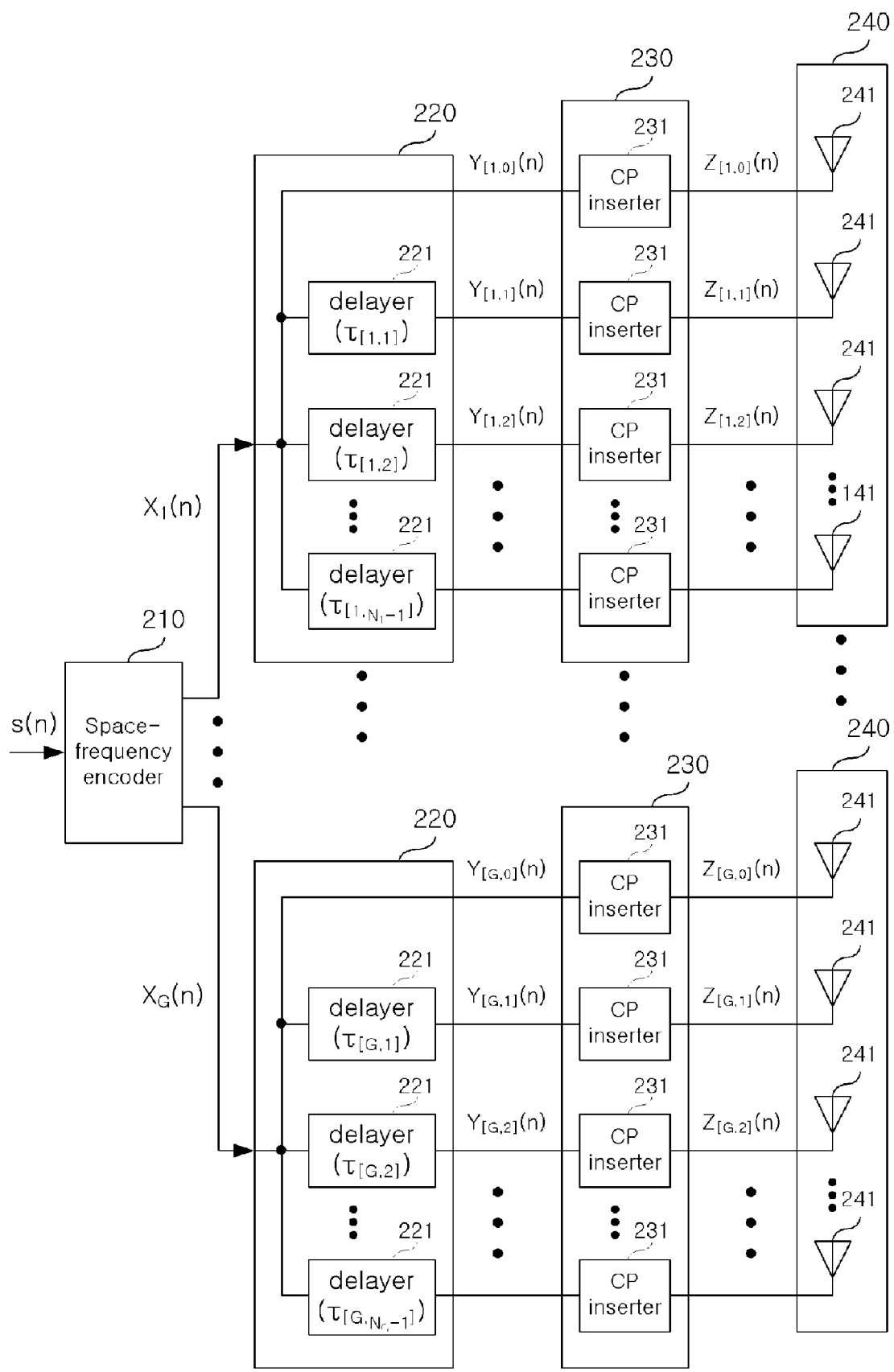
[Fig. 3]

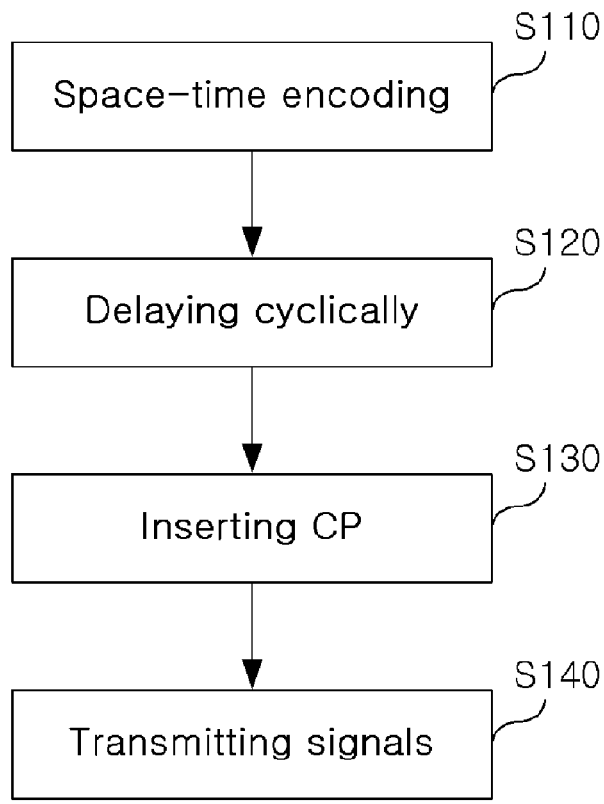
[Fig. 4]
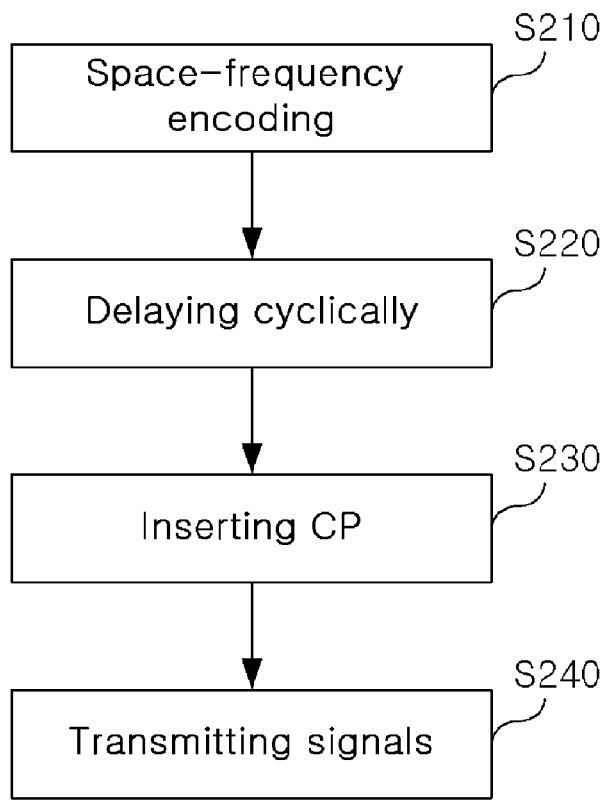
[Fig. 5]

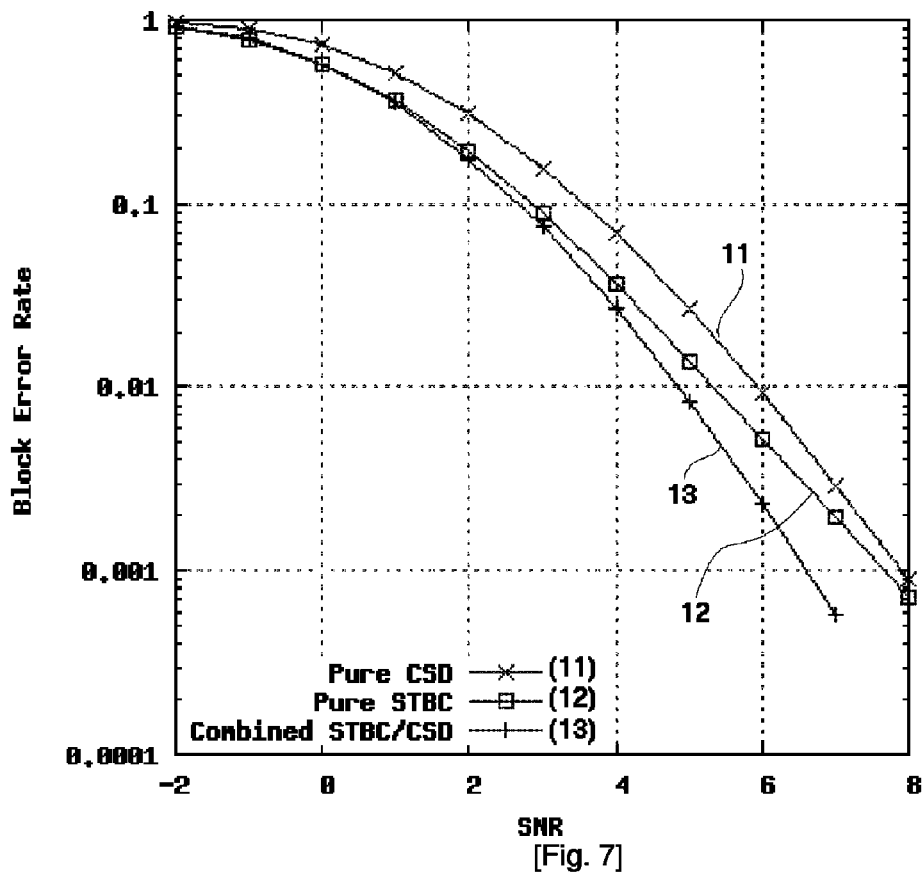
[Fig. 6]
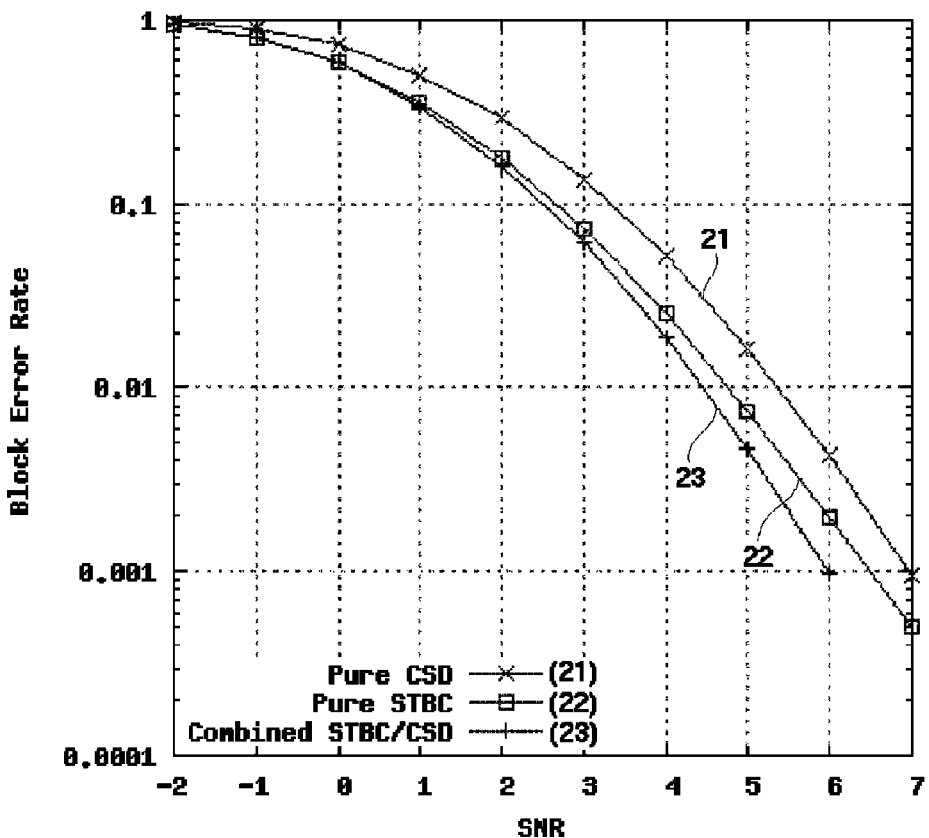
[Fig. 7]

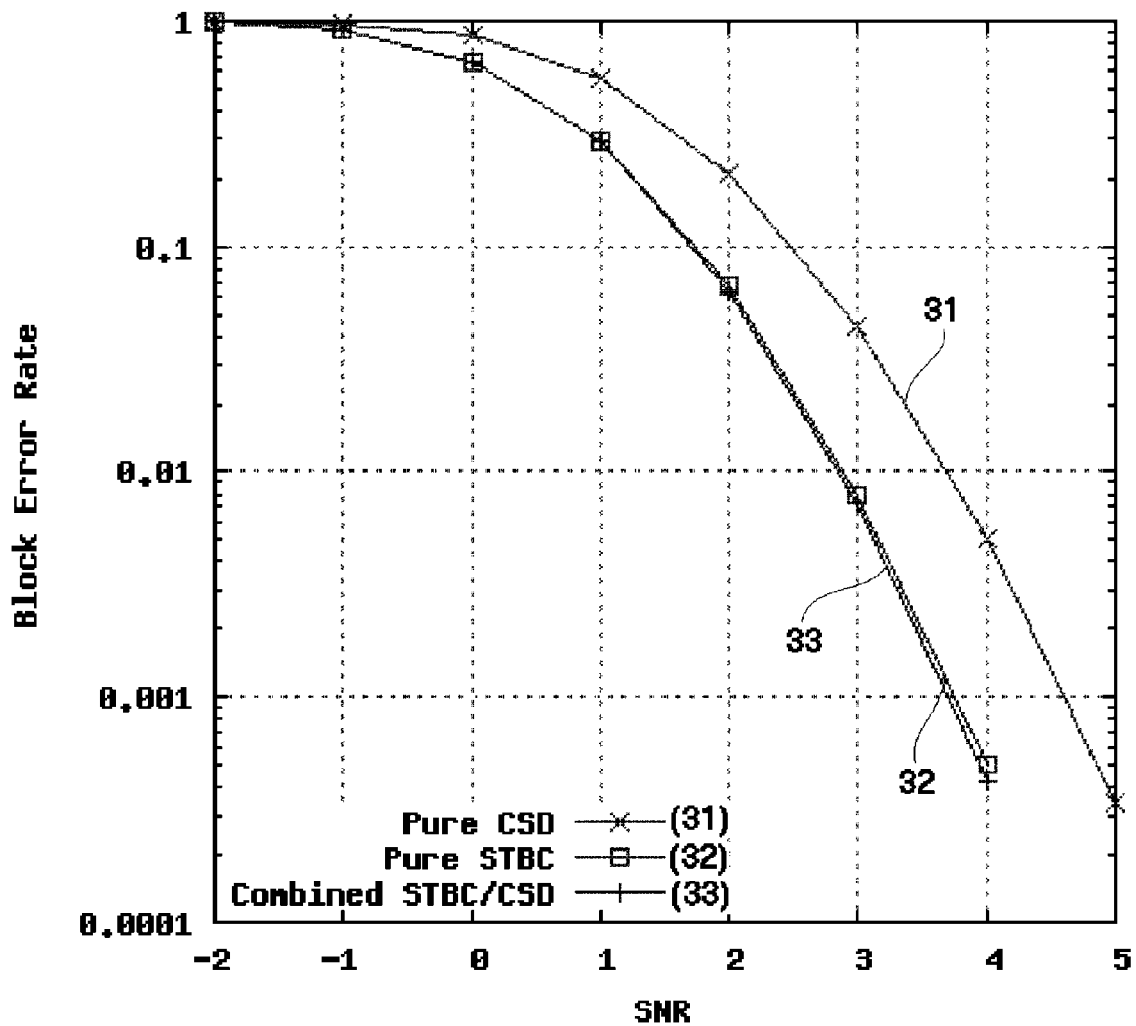

APPARATUS AND METHOD FOR TRANSMITTING SIGNALS WITH MULTIPLE ANTENNAS

TECHNICAL FIELD

The present invention relates an apparatus and a method for transmitting signals with multiple antennas. In particular, the present invention relates a signal transmission apparatus that has low reception complexity, and of which the number of antennas may be expanded easily.

BACKGROUND ART

Important issues for designing the multiple antenna transmission apparatus are diversity gain and reception complexity. One of methods for getting the maximum diversity gain is the Alamouti transmission method.

The signal transmission apparatus according to the Alamouti transmission method includes two antennas, and has a transmission efficiency of 1. As the signal transmission apparatus according to the Alamouti transmission method has the maximum diversity gain and low reception complexity, it is widely used. However, if the signal transmission apparatus according to the Alamouti transmission method has 3 or more antennas, it does not have a transmission efficiency of 1 for the maximum diversity gain and low reception complexity. Also, the signal transmission apparatus has large reception complexity for the maximum diversity gain and the transmission efficiency of 1.

To resolve this problem, a method ('IEEE802.16e/D12, Part 16: Air interface for fixed and mobile broadband wireless access systems', October 2005, p. 473-474) of using two Alamouti Blocks such as in Equation 1 has been disclosed.

$$\begin{pmatrix} s_1 & -s_2^* & 0 & 0 \\ s_2 & s_1^* & 0 & 0 \\ 0 & 0 & s_3 & -s_4^* \\ 0 & 0 & s_4 & s_3^* \end{pmatrix}$$ [Equation 1]

In the matrix of Equation 1, symbols of each row mean symbols transmitted to different antennas respectively, symbols of the first row and the third row mean symbols transmitted at a time k, and symbols of the second row and the fourth row mean symbols transmitted at a time k+1. The first Alamouti block consisting of the first row and the second row and the second Alamouti block consisting of the third row and the fourth row are transmitted through different orthogonal resources (or subcarriers).

However, the signal transmission apparatus according to the method such as Equation 1 has a loss of diversity gain for low reception complexity and a transmission efficiency of 1. Also, the method such as Equation 1 is not suitable for a signal transmission apparatus with 3 or 5 antennas.

DISCLOSURE OF INVENTION

Technical Problem

The present invention has been made in an effort to provide a signal transmission apparatus that has low reception complexity, and of which the number of antennas may be expanded easily.

Technical Solution

An exemplary embodiment of the present invention provides a signal transmission apparatus including a space-time encoder, a plurality of delayer groups respectively corresponding to a plurality of space areas, and a plurality of antenna groups respectively corresponding to the plurality of delayer groups. The space-time encoder encodes a symbol group at a plurality of space areas and one or more time areas, to output for every one time area a plurality of encoded symbols that respectively correspond to the plurality of space areas. Each delayer group cyclically delays with a plurality of delay-values the encoded symbol of the space area to which each delayer group corresponds to generate a plurality of delayed symbols. Each antenna group transmits to the channel the plurality of delayed symbols of the delayer group to which the each antenna group corresponds.

Another exemplary embodiment of the present invention provides a signal transmission apparatus including a space-frequency encoder, a plurality of delayer groups respectively corresponding to a plurality of space areas, and a plurality of antenna groups respectively corresponding to the plurality of delayer groups. The space-frequency encoder encodes a symbol group at a plurality of space areas and one or more frequency areas to output to every frequency area a plurality of encoded symbols that respectively correspond to the plurality of space areas. Each delayer group cyclically delays with a plurality of delay-values the encoded symbol of the space area to which each delayer group corresponds to generate a plurality of delayed symbols. Each antenna group transmits to the channel the plurality of delayed symbols of the delayer group to which the each antenna group corresponds.

A signal transmission apparatus according to an exemplary embodiment of the present invention encodes a symbol group at a plurality of space areas and one or more time areas to output every time area a plurality of encoded symbols that respectively correspond to the plurality of space areas. The signal transmission apparatus cyclically delays the encoded symbol with a plurality of delay-values to generate a plurality of delayed symbols, and transmits the plurality of delayed symbols to the channel.

A signal transmission apparatus according to another exemplary embodiment of the present invention encodes a symbol group at a plurality of space areas and one or more frequency areas to output to every frequency area a plurality of encoded symbols that respectively correspond to the plurality of space areas. The signal transmission apparatus cyclically delays the encoded symbol with a plurality of delay-values to generate a plurality of delayed symbols, and transmits the plurality of delayed symbols to the channel.

BRIEF DESCRIPTION OF THE DRAWINGS

FIG. 1 is a block diagram of a signal transmission apparatus according to the first exemplary embodiment of the present invention.

FIG. 2 shows the delayed symbol and the guard-inserted symbol according to an exemplary embodiment of the present invention.

FIG. 3 is a block diagram of a signal transmission apparatus according to the second exemplary embodiment of the present invention.

FIG. 4 is a flowchart of the signal transmission method according to the first exemplary embodiment of the present invention.

FIG. 5 is a flowchart of the signal transmission method according to the second exemplary embodiment of the present invention.

FIG. 6 is a graph of the performance of the signal transmission apparatus that transmits signals through 4 antennas in the flat fading channel environment.

FIG. 7 is a graph of performance of the signal transmission apparatus that transmits the signals through 4 antennas in the slowly selective fading channel environment.

FIG. 8 is a graph of the performance of the signal transmission apparatus that transmits the signals through 4 antennas in the highly selective fading channel environment.

MODE FOR THE INVENTION

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention. In addition, the drawings and description are to be regarded as illustrative in nature and not restrictive, and like reference numerals designate like elements throughout the specification.

Throughout this specification and the claims which follow, unless explicitly described to the contrary, the word "comprise" or variations such as "comprises" or comprising will be understood to imply the inclusion of stated elements but not the exclusion of any other elements.

FIG. 1 is a block diagram of a signal transmission apparatus 100 according to the first exemplary embodiment of the present invention.

As shown in FIG. 1, the signal transmission apparatus 100 includes a space-time encoder 110, G delayer groups 120, G guard-inserter groups 130, and G antenna groups 140.

The space-time encoder 110 encodes a symbol group s(n) at G space areas and m time areas to generate G*m encoded symbols. At this time, the space area is a term used in the space-time encoder 110. One space area corresponds to not one antenna but one antenna group. The space-time encoder 110 outputs G encoded symbols corresponding to G space areas at time areas from 1 to m. That is, the space-time encoder 110 outputs G encoded symbols every one time area. The space-time encoder 110 may be an Alamouti encoder, a Space-time transmission diversity encoder, a V-BLAST encoder, etc.

Next, the space-time encoder 110 will be described with the Alamouti encoder, the Space-time transmission diversity encoder, and the V-BLAST encoder.

When the space-time encoder 110 is the Alamouti encoder, it operates according to Equation 2.

$$\begin{pmatrix} x_1(2k) & x_1(2k+1) \\ x_2(2k) & x_2(2k+1) \end{pmatrix} = \begin{pmatrix} s(2k) & -s^*(2k+1) \\ s(2k+1) & s^*(2k) \end{pmatrix} \quad \text{[Equation 2]}$$

That is, the Alamouti encoder encodes 2 symbols {s(2k), s(2k+1)} at 2 space areas and 2 time areas to generate 4 encoded symbols {s(2k), s(2k+1), −s*(2k+1), s*(2k)}. In the matrix of Equation 2, symbols of each row mean symbols transmitted to a different space area, and symbols of each column mean symbols transmitted to a different time area. According to Equation 2, at a time area 2k the Alamouti encoder outputs a symbol s(2k) for the first space area, and outputs a symbol s(2k+1) for the second space area. Also, at a time area 2k+1 the Alamouti encoder outputs a symbol −s*(2k+1) for the first space area, and outputs a symbol s(2k) for the second space area.

When the space-time encoder 110 is the Space-time transmission diversity encoder, it operates according to Equation 3.

$$\begin{pmatrix} x_1(2k) & x_1(2k+1) \\ x_2(2k) & x_2(2k+1) \end{pmatrix} = \begin{pmatrix} s(2k) & -s(2k+1) \\ s^*(2k+1) & s^*(2k) \end{pmatrix} \quad \text{[Equation 3]}$$

That is, the space-time transmission diversity encoder encodes 2 symbols {s(2k), s(2k+1)} at 2 space areas and 2 time areas to generate 4 encoded symbols {s(2k), −s (2k+1), s(2k+1), s*(2k)}. According to Equation 2, at a time area 2k the space-time transmission diversity encoder outputs a symbol s(2k) for the first space area, and outputs a symbol −s* (2k+1) for the second space area. Also, at a time area 2k+1 the space-time transmission diversity encoder outputs a symbol s(2k+1) for the first space area, and outputs a symbol s*(2k) for the second space area.

When the space-time encoder 110 is the V-BLAST encoder, it operates according to Equation 4.

$$\begin{pmatrix} x_1(k) \\ x_2(k) \end{pmatrix} = \begin{pmatrix} s(2k) \\ s(2k+1) \end{pmatrix} \quad \text{[Equation 4]}$$

That is, the V-BLAST encoder encodes 2 symbols {s(2k), s(2k+1)} at 2 space areas and one time area to generate 2 encoded symbols {s(2k), s(2k+1)}. According to Equation 4, at a time area k the V-BLAST encoder outputs a symbol s(2k) for the first space area, and outputs a symbol s(2k+1) for the second space area.

Also, the signal transmission apparatus 100 includes G delayer groups 120. The G delayer groups 120 respectively correspond to G space areas. Each delayer group 120 includes a plurality of delayers 121, and each delayer 121 receives a symbol of the space areas to which each delayer group 120 corresponds from the space-time encoder 110, and cyclically delays the received symbol with a delay-value to generate a cyclically-delayed symbol. Therefore, each delayer group 120 receives a symbol $X_g(n)$ of the space areas to which the each delayer group 120 correspond from the space-time encoder 110, and cyclically delays the received symbol $X_g(n)$ with a plurality of delay-values ($T_{[g,0]}=0, T_{[g,1]}, T_{[g,2]}, \ldots$) to generate a plurality of cyclically-delayed symbols ($Y_{[g,0]}, Y_{[g,1]}, \ldots$).

Also, the signal transmission apparatus 100 includes G guard-inserter groups 130. The G guard-inserter groups 130 respectively correspond to G delayer groups 120. Each guard-inserter group 130 includes a plurality of guard-inserters 131. The number of guard-inserters 131 equals the number of delayers 121 that the delayer group 120 to which the guard-inserter group 130 corresponds includes. Each guard-inserter group 130 receives delayed symbols ($Y_{[g,0]}, Y_{[g,1]}, \ldots$) from delayer groups 120 to which each guard-inserter group 130 corresponds, and inserts a guard-interval to received symbols ($Y_{[g,0]}, Y_{[g,1]}, \ldots$) to generate a plurality of guard-inserted symbols ($Z_{[g,0]}, Z_{[g,1]}, \ldots$).

Next, the delayed symbol that the delayer group 120 generates and the guard-inserted symbol that the guard-inserter group 130 generates will be described with reference to FIG. 2.

FIG. 2 shows the delayed symbol and the guard-inserted symbol according to an exemplary embodiment of the present invention. Specifically, FIG. 2 shows the delayed symbols and the guard-inserted symbols that are generated through an encoded symbol $X_1$ that the space-time encoder 110 outputs for a space area 1.

The space-time encoder 110 generates an encoded symbol $X_1$ to provide to the delayer group 120. The encoded symbol $X_1$ is a symbol that has a symbol period T and is not yet delayed.

When the delayer group 120 delays the encoded symbol $X_1$ with 3 delay-values of 0, T/4, and T/2, the delayer group 120 generates 3 delayed symbols of $Y_{[1,0]}$, $Y_{[1,1]}$, $Y_{[1,2]}$. As the symbol Y is a symbol that is cyclically delayed through the delay-value 0, the symbol Y equals the symbol $X_1$. The delayer group 120 removes the last part of T/4 from the encoded symbol $X_1$ and adds the removed part in front of the encoded symbol $X_1$ to generate the symbol $Y_{[1,1]}$. Also, the delayer group 120 removes the last part of T/2 from the encoded symbol $X_1$ and adds the removed part in front of the encoded symbol $X_1$ to generate the symbol $Y_{[1,2]}$.

The guard-inserter group 130 adds the cyclic prefix in front of $Y_{[1,0]}$, $Y_{[1,1]}$, and $Y_{[1,2]}$ to generate the guard-inserted symbols $Z_{[1,0]}$, $Z_{[1,1]}$, and $Z_{[1,2]}$, respectively.

Again, FIG. 1 will be described. The signal transmission apparatus 100 includes G antenna groups 140, and the G antenna groups 140 respectively correspond to G guard-inserter groups 130. Each antenna group 140 includes a plurality of antennas 141. The number of antennas 141 equals the number of guard-inserters 131 that the guard-inserter group 130 to which the antenna group 140 corresponds includes. Therefore, the antenna 141 receives a guard-inserted symbol from the guard-inserter 131 to which the antenna 141 corresponds, and transmits the guard-inserted symbol to a channel.

If the signal transmission apparatus 100 does not include guard-inserter groups 130, G antenna groups 140 correspond to G delayer groups 120 respectively. The number of antennas 141 of each antenna groups 140 equals the number of delayers 121 that the delayer group 120 to which the each antenna group 140 corresponds includes.

FIG. 3 is a block diagram of a signal transmission apparatus 200 according to the second exemplary embodiment of the present invention.

As shown in FIG. 3, the signal transmission apparatus 200 includes a space-frequency encoder 210, G delayer groups 220, G guard-inserter groups 230, and G antenna groups 240.

The space-frequency encoder 210 encodes a symbol group s(n) for G space areas and m frequency areas to generate G*m encoded symbols. The space-frequency encoder 210 outputs G encoded symbols corresponding to G space areas at frequency areas from 1 to m. That is, the space-frequency encoder 210 outputs G encoded symbols for every frequency area. The space-frequency encoder 210 may be an Alamouti encoder, a V-BLAST encoder, etc.

The signal transmission apparatus 200 includes G delayer groups 220. The G delayer groups 220 respectively correspond to G space areas. Each delayer group 220 includes a plurality of delayers 221, and each delayer 221 receives a symbol of the space areas to which each delayer group 220 corresponds from the space-frequency encoder 210, and cyclically delays the received symbol with a delay-value to generate a cyclically-delayed symbol. Therefore, each delayer group 220 receives the symbol X (n) of the space areas to which each delayer group 220 corresponds from the space-time encoder 210, and cyclically delays the received symbol $X_g(n)$ with a plurality of delay-values($T_{[g,0]}=0$, $T_{[g,1]}$, $T_{[g,2]}$, ... ) to generate a plurality of cyclically-delayed symbols($Y_{[g,0]}$, $Y_{[g,1]}$, ... ).

Also, the signal transmission apparatus 200 includes G guard-inserter groups 230. The G guard-inserter groups 230 respectively correspond to G delayer groups 220. Each guard-inserter group 230 includes a plurality of guard-inserters 231. The number of guard-inserters 231 equals the number of delayers 221 that the delayer group 220 to which the guard-inserter group 230 corresponds includes. Each guard-inserter group 230 receives delayed symbols ($Y_{[g,0]}$, $Y_{[g,1]}$, ... ) from the delayer group 220 to which each guard-inserter group 230 corresponds, and inserts a guard-interval to received symbols ($Y_{[g,0]}$, $Y_{[g,1]}$, ... ) to generate a plurality of guard-inserted symbols ($Z_{[g,0]}$, $Z_{[g,1]}$, ... ).

The signal transmission apparatus 200 includes G antenna groups 240, and the G antenna groups 240 respectively correspond to G guard-inserter groups 230. Each antenna group 240 includes a plurality of antennas 241. The number of antennas 241 of each antenna group 240 equals the number of guard-inserters 231 that the guard-inserter group 230 to which the each antenna group 240 corresponds includes. Therefore, the antenna 241 receives a guard-inserted symbol from the guard-inserter 231 to which the antenna 241 corresponds, and transmits the guard-inserted symbol to a channel.

Next, signal transmission methods according to various exemplary embodiments of the present invention will now be described with reference to FIG. 4 and FIG. 5.

FIG. 4 is a flowchart of the signal transmission method according to the first exemplary embodiment of the present invention.

In step S110, the space-time encoder 110 encodes a symbol group at a plurality of space areas and one or more time areas to output every time area a plurality of encoded symbols that respectively correspond to the plurality of space areas.

In step S120, the delayer group 120 cyclically delays each encoded symbol with a plurality of delay-values to generate a plurality of delayed symbols.

Next, in step S130, the guard-inserter group 130 receives the plurality of delayed symbols from the delayer group 120 and inserts a guard-interval (or cyclic prefix) to the plurality of delayed symbols to generate a plurality of guard-inserted symbols.

Finally, in step S140, the signal transmission apparatus 100 transmits the plurality of guard-inserted symbols to the channel through a plurality of antennas. If the signal transmission apparatus 100 does not include guard-inserter groups 130, the signal transmission apparatus 100 transmits the plurality of delayed symbols to the channel through the plurality of antennas.

FIG. 5 is a flowchart of the signal transmission method according to the second exemplary embodiment of the present invention.

In step S210, the space-frequency encoder 210 encodes a symbol group at a plurality of space areas and one or more frequency areas to output to every frequency area a plurality of encoded symbols that respectively correspond to the plurality of space areas.

In step S220, the delayer group 220 cyclically delays each encoded symbol with a plurality of delay-values to generate a plurality of delayed symbols.

Next, in step S230, the guard-inserter group 230 receives the plurality of delayed symbols from the delayer group 220 and inserts a guard-interval (or cyclic prefix) to the plurality of delayed symbols to generate a plurality of guard-inserted symbols.

Finally, in step S240, the signal transmission apparatus 200 transmits the plurality of guard-inserted symbols to the channel through a plurality of antennas. If the signal transmission apparatus 200 does not include guard-inserter groups 230, the signal transmission apparatus 200 transmits the plurality of delayed symbols to the channel through the plurality of antennas.

Next, the performance of the signal transmission apparatus according to the exemplary embodiments of the present invention will be described with reference to FIG. 6, FIG. 7 and FIG. 8.

FIG. 6 is a graph of the performance of the signal transmission apparatus that transmits signals of the code rate ⅔ through 4 antennas in the flat fading channel environment. FIG. 7 is a graph of the performance of the signal transmission apparatus that transmits the signals through 4 antennas in the slowly selective fading channel environment or the Pedestrian A channel environment. FIG. 8 is a graph of the performance of the signal transmission apparatus that transmits the signals through 4 antennas in the highly selective fading channel environment or the TU channel environment.

In FIG. 6, FIG. 7, and FIG. 8, the graphs 11, 21, and 31 of the Pure CSD show the performance of the multiple antenna transmission apparatus that delays a symbol with 4 delay-values according to the cyclic delay diversity technology to generate 4 delayed symbols, and transmits the 4 delayed symbols through 4 antennas to the channel. The graphs 12, 22, and 32 of the Pure STBC (Space-Time Block Codes) show the performance of the multiple antenna transmission apparatus that generates 4 symbols according to Equation 1 and transmits the 4 symbols through 4 antennas to the channel. The graphs 13, 23, and 33 of Combined STBC/CSD show the performance of the multiple antenna transmission apparatus according to the exemplary embodiments of the present invention, which includes the Alamouti encoder, and it delays 2 output symbols of the Alamouti encoder with 2 delay-values to generate 4 delayed symbols and transmits the 4 delayed symbols through 4 antennas.

Referring to FIG. 6, the block error rate of the multiple antenna transmission apparatus according to the exemplary embodiments of the present invention is lower in the flat fading channel environment than the block error rate of the multiple antenna transmission apparatus according to the Pure CSD or the Pure STBC.

Referring to FIG. 7, the block error rate of the multiple antenna transmission apparatus according to the exemplary embodiments of the present invention is lower in the slowly-selective fading channel environment than the block error rate of the multiple antenna transmission apparatus according to the Pure CSD or the Pure STBC.

Referring to FIG. 8, in the highly-selective fading channel environment the block error rate of the multiple antenna transmission apparatus according to the exemplary embodiments of the present invention is similar to the block error rate of the multiple antenna transmission apparatus according to the Pure STBC. But in the highly-selective fading channel environment the block error rate of the multiple antenna transmission apparatus according to the exemplary embodiments of the present invention is lower than the block error rate of the multiple antenna transmission apparatus according to the Pure CSD.

The recording medium may include all types of recording mediums that a computer can read, for example an HDD, a memory, a CD-ROM, a magnetic tape, and a floppy disk, and it may also be realized in a carrier wave (e.g., Internet communication) format.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

INDUSTRIAL APPLICABILITY

According to an exemplary embodiment of the present invention, by changing the number of space areas for encoding and the number of delay-values for delaying, the number of antennas for the multiple antenna transmission apparatus is easily expanded.

In addition, the multiple antenna transmission apparatus according to an exemplary embodiment of the present invention has better performance than the multiple antenna transmission apparatus according to the Pure CSD or the Pure STBC.

The invention claimed is:

1. An apparatus for transmitting data to a channel comprising:
   a space-time encoder encoding a symbol group at a plurality of space areas and one or more time areas to output at every one time area, a plurality of encoded symbols that respectively correspond to the plurality of space areas;
   a plurality of delayer groups respectively corresponding to the plurality of space areas, wherein the each delayer group receives an encoded symbol of the space areas to which the each delayer group corresponds from the space-time encoder and cyclically delays the encoded symbol of the space areas with a plurality of delay-values to generate a plurality of delayed symbols wherein one space area corresponds to a plurality of delay-values; and
   a plurality of antenna groups respectively corresponding to the plurality of delayer groups, wherein the each antenna group includes a plurality of antennas and corresponds to one space area and a delayer group, and transmits the plurality of delayed symbols of the delayer group to the channel.

2. The apparatus of claim 1, further comprising a plurality of guard-inserter groups corresponding to the plurality of delayer groups,
   wherein the each guard-inserter group inserts a guard interval to the plurality of delayed symbols of the delayer group to which the each guard-inserter group corresponds to generate a plurality of guard-inserted symbols,
   wherein the plurality of antenna groups respectively correspond to the plurality of guard-inserter groups, and
   wherein the each antenna group transmits the plurality of guard-inserted symbols of the guard-inserter group to which the each antenna group corresponds to the channel.

3. The apparatus of claim 2, wherein the space-time encoder is an Alamouti encoder that encodes the symbol group at two space areas and two time areas.

4. The apparatus of claim 2, wherein the space-time encoder is a space-time transmission diversity encoder that encodes the symbol group at two space areas and two time areas.

5. The apparatus of claim 2, wherein the space-time encoder is a V-BLAST encoder that encodes the symbol group at two space areas and one time area.

6. The apparatus of claim 2, wherein one of the plurality of delay-values is zero.

7. The apparatus of claim 2, wherein the each delayer group cyclically delays the encoded symbol with two delay-values to generate two delayed symbols.

8. A method for transmitting data to a channel comprising:
encoding a symbol group at a plurality of space areas and one or more time areas to output at every one time area a plurality of encoded symbols that respectively correspond to the plurality of space areas;
receiving an encoded symbol of the space areas;
cyclically delaying the encoded symbol of the space areas with a plurality of delay-values to generate a plurality of delayed symbols wherein one space area corresponds to a plurality of delay-values; and
transmitting the plurality of delayed symbols via an antenna group corresponding to each space area, to the channel.

9. The method of claim 8, further comprising inserting a guard interval to the plurality of delayed symbols to generate a plurality of guard-inserted symbols, wherein transmitting the plurality of delayed symbols comprises transmitting the plurality of guard-inserted symbols to the channel.

10. An apparatus for transmitting data to a channel, comprising:
a space-frequency encoder encoding a symbol group at a plurality of space areas and one or more frequency areas to output to every frequency area, a plurality of encoded symbols that respectively correspond to the plurality of space areas;
a plurality of delayer groups respectively corresponding to the plurality of space areas, wherein the each delayer group receives an encoded symbol of the space areas to which the each delayer group corresponds from the space-time encoder and cyclically delays the encoded symbol of the space areas with a plurality of delay-values to generate a plurality of delayed symbols wherein one space area corresponds to a plurality of delay values; and
a plurality of antenna groups respectively corresponding to the plurality of delayer groups, wherein the each antenna group includes a plurality of antennas and corresponds to one space area and a delayer group, and transmits the plurality of delayed symbols of the delayer group to the channel.

11. The apparatus of claim 10, further comprising a plurality of guard-inserter groups corresponding to the plurality of delayer groups,
wherein the each guard-inserter group inserts a guard interval to the plurality of delayed symbols of the delayer group to which the each guard-inserter group corresponds to generate a plurality of guard-inserted symbols,
wherein the plurality of antenna groups respectively correspond to the plurality of guard-inserter groups, and
wherein the each antenna group transmits the plurality of guard-inserted symbols of the guard-inserter group to which the each antenna group corresponds to the channel.

12. The apparatus of claim 11, wherein the space-frequency encoder is an Alamouti encoder that encodes the symbol group at two space areas and two frequency areas.

13. The apparatus of claim 12, wherein the each delayer group cyclically delays the encoded symbol with two delay-values to generate two delayed symbols.

14. A method for transmitting data to a channel comprising:
encoding a symbol group at a plurality of space areas and one or more frequency areas to output to every frequency area, a plurality of encoded symbols that respectively correspond to the plurality of space areas;
receiving an encoded symbol of the space areas
cyclically delaying the encoded symbol of the space areas with a plurality of delay-values to generate a plurality of delayed symbols wherein one space area corresponds to a plurality of delay-values; and
transmitting the plurality of delayed symbols via an antenna group corresponding to each space area, to the channel.

15. The method of claim 14, further comprising inserting a guard interval to the plurality of delayed symbols to generate a plurality of guard-inserted symbols, wherein transmitting the plurality of delayed symbols comprises transmitting the plurality of guard-inserted symbols to the channel.

* * * * *